United States Patent [19]
Stephens, Jr.

[11] Patent Number: 5,999,477
[45] Date of Patent: Dec. 7, 1999

[54] DISTRIBUTED ARRAY ACTIVATION ARRANGEMENT

[75] Inventor: Michael C. Stephens, Jr., San Jose, Calif.

[73] Assignee: Vanguard International Semiconductor Corporation, Taiwan

[21] Appl. No.: 09/103,676

[22] Filed: Jun. 23, 1998

[51] Int. Cl.[6] .................................................... G11C 8/00
[52] U.S. Cl. ..................................... 365/230.03; 365/206
[58] Field of Search ................................ 365/230.03, 206

[56] References Cited

U.S. PATENT DOCUMENTS

| | | |
|---|---|---|
| 4,596,001 | 6/1986 | Baba . |
| 4,809,229 | 2/1989 | Nukiyama . |
| 4,811,297 | 3/1989 | Ogawa . |
| 5,058,058 | 10/1991 | Yasuda et al. . |
| 5,276,649 | 1/1994 | Hoshita et al. . |
| 5,377,151 | 12/1994 | Komuro . |
| 5,734,617 | 3/1998 | Zheng ................................ 365/225.7 |

*Primary Examiner*—David Nelms
*Assistant Examiner*—M. Tran
*Attorney, Agent, or Firm*—Christensen, O'Connor, Johnson & Kindness PLLC

[57] ABSTRACT

An activation arrangement for reducing worst case localized supply noise for shared circuitry includes a first group of circuit blocks, a second group of circuit blocks, a shared circuit, and a selection circuit. The first and second circuit blocks are arranged symmetrically about the shared circuit. The selection circuit is configured to selectively activate each circuit block in the first group and, concurrently, a circuit block in the second group corresponding to the circuit block of the first group. The selection circuit is configured so that when the circuit block of the first group that is closest to the shared circuit is to be activated, the corresponding circuit block in the second group is the circuit block that is farthest from the shared circuit. In a similar manner, the selection circuit is configured so that when the circuit block in the first group that is second closest to the shared circuit is to be activated, the corresponding circuit block in the second group is the circuit block that is second farthest from the shared circuit, and so on.

30 Claims, 4 Drawing Sheets

5,999,477

DISTRIBUTED ARRAY ACTIVATION ARRANGEMENT

FIELD OF THE INVENTION

The present invention relates to integrated circuits and, more particularly, to integrated circuit devices that have circuit blocks that are simultaneously activated. Still more particularly, the present invention relates to circuit block arrangements that reduce supply noise in the supply voltage buses when circuit blocks are simultaneously activated.

BACKGROUND INFORMATION

Some integrated circuits include several similar circuit blocks that are arranged in the integrated circuit in close proximity to each other and to shared circuitry. Moreover, in some of these integrated circuits, several circuit blocks are activated substantially simultaneously, resulting in a condition referred to herein as localized supply noise. More specifically, this simultaneous activation of the circuit blocks can cause a relatively large localized change in the voltage level at the supply voltage buses in the areas near the activated circuit blocks. In this context, the term "supply noise" as used herein refers to both dips and rises in the localized voltage level. Supply noise in the supply voltage levels may cause circuitry in these regions to operate improperly or with degraded performance. Because supply noise from more than one circuit block may be additive, this problem is exacerbated in mirrored placement arrangements that are commonly used in some types of integrated circuit devices.

FIG. 1 is a diagram illustrative of a portion of conventional mirrored array block arrangement 10 for a memory device. Mirrored arrangements are typically used to allow the circuit blocks to share circuitry placed between the circuit blocks. For example, the shared circuitry may include control logic, address decoders, charge pumps, etc. In this portion of arrangement 10, shared circuitry 11 is disposed between array blocks $12_1$–$12_4$ and $13_1$–$13_4$. Array blocks $12_1$–$12_4$ and $13_1$–$13_4$ are arranged in mirrored-symmetry about shared circuitry 11 in a line that contains the array blocks and shared circuitry. In particular, array blocks $12_4$ and $13_1$ are located closest to and on opposite sides of shared circuitry 11, with array blocks $12_3$ and $13_2$ being next closest to and on opposite sides of shared circuitry 11, and so on.

In addition, in this example of a conventional system, the activation of the array blocks is mirrored. More specifically, when address location 00X (for an N-bit address, X indicates the least significant N-2 bits of the address) is being accessed, the two array blocks located closest on either side of shared circuitry 11 (i.e., array blocks $12_4$ and $13_1$) are activated, as indicated by arrows A1 in FIG. 1. The address 00X represents an subset of the full address corresponding to the selection or activation of array blocks. Those skilled in the art of memory devices will appreciate that additional lower level address bits are included in the full address for selecting particular wordlines within an array block. These lower level bits of the full address are omitted for clarity. Similarly, the full address may include additional higher order bits for selecting other array blocks. That is, the portion of the structure shown in FIG. 1 is typically part of a larger memory structure, with more memory arrays.

As can be seen in FIG. 1, the physical locations of the "00X" array blocks are mirrored about the location of shared circuitry 11. Similarly, when address location 01X is being accessed, array blocks $12_3$ and $13_2$ (i.e., the next closest array blocks on either side of shared circuitry 11) are activated as indicated by arrows A2. Likewise, address locations 10X and 11X respectively correspond to array block pairs $12_2$ and $13_3$, and $12_1$ and $13_4$, as indicated by arrows A3 and A4.

In this example, each array block includes two banks of sense amplifiers 14, one bank each on opposite sides of the array block and parallel to the wordlines corresponding to the array block. Array blocks typically have a large number of wordlines (e.g., 256 wordlines in a sixteen Mb DRAM device). For purposes of this description, a single representative wordline for each array block is shown in FIG. 1, with these wordlines corresponding to the same lower order address bits. For example, array blocks $12_1$–$12_4$, respectively, have wordlines $15_1$–$15_4$ running through the respective array block. Similarly, array blocks $13_1$–$13_4$, respectively, have wordlines $16_1$–$16_4$ running through the respective array block. As stated above, wordlines $15_1$–$15_4$ and $16_1$–$16_4$ all correspond to the same set of lower order address bits.

An array block decoder 17 receives an address (e.g., 00X through 11X) and activates the appropriate array block to activate the appropriate wordline. As shown schematically in FIG. 1, decoder 17 is connected to a set of decoder lines. More specifically, in this example, decoder 17 drives a first decoder line having segments $18_1$ and $19_1$, a second decoder line having segments $18_2$ and $19_2$, a third decoder line having segments $18_3$ and $19_3$, and a fourth decoder line having segments $18_4$ and $19_4$. Although shown in separate segments in FIG. 1 separated by decoder 17, the segments of a decoder line may be continuous. Further, for clarity, only four decoder lines and eight array blocks are shown. As previously mentioned, a memory device would likely include a much larger number of such array blocks, wordlines and decoder lines.

This conventional activation arrangement is typically implemented so that a particular decoder line corresponds to a particular pair of array blocks that are arranged in a mirrored fashion about shared circuitry 11. Connection structures (e.g., contacts and vias) are used to interconnect the decoder line to wordline decoders of the corresponding wordlines. In the example arrangement of FIG. 1, decoder line segments $18_1$ and $19_1$, respectively, are connected to the wordline decoders $D15_4$ and $D16_1$ of wordlines $15_4$ and $16_1$ through connection points C0 and C0', respectively. Similarly, decoder line segments $18_2$ and $19_2$ are respectively connected to the wordline decoders $D15_3$ and $D16_2$ for wordlines $15_3$ and $16_2$ through connection structures C1 and C1', respectively, and so on.

One problem with this conventional mirrored arrangement is that when address location 00X is accessed, the two array blocks closest to shared circuitry 11 (i.e., array blocks $12_4$ and $13_1$) are activated. The activation of the array blocks and the associated sense amplifiers tend to cause localized supply noise. Moreover, due to the close proximity of shared circuitry 11 to the activated array blocks, the supply bus regions proximate to shared circuitry 11 experience relatively high localized supply noise, thereby making shared circuitry 11 more susceptible to erroneous operation and/or degraded performance when this particular address is accessed. Accordingly, there is a need for a method or structure that reduces the worst case supply bus noise for circuit block architectures that use shared circuitry with minimal impact on the circuit block/shared circuitry architecture.

SUMMARY

In accordance with the present invention, an activation arrangement for minimizing worst case localized supply noise for shared circuitry is provided. In one embodiment, the arrangement includes a first group of circuit blocks, a second group of circuit blocks, a shared circuit, and a selection circuit. In one application, the first and second circuit blocks are array blocks of a memory integrated circuit device. The first and second circuit blocks are arranged symmetrically about the shared circuit. The selection circuit is configured to selectively activate each circuit block in the first group and, concurrently, a circuit block in the second group corresponding to the circuit block of the first group.

In addition, the selection circuit is configured so that when the circuit block of the first group that is closest to the shared circuit is to be activated, the corresponding activated circuit block in the second group is not the circuit block closest to the shared circuit. Thus, in accordance with the present invention, mirrored placement of circuit blocks is used with non-mirrored (e.g., stepped) activation of the circuit blocks. Moreover, in this embodiment, the selection circuit is configured so that when the circuit block of the first group that is closest to the shared circuit is to be activated, the corresponding activated circuit block in the second group is the circuit block that is farthest from the shared circuit. In a similar manner, the selection circuit is configured so that when the circuit block in the first group that is second closest to the shared circuit is to be activated, the corresponding circuit block in the second group is the circuit block that is second farthest from the shared circuit, and so on.

Unlike the aforementioned conventional mirrored arrangement, the two circuit blocks closest to the shared circuit are not concurrently activated, thereby advantageously reducing supply noise. This embodiment is advantageously used to arrange the activation of the array blocks of a high density memory device, which has wordlines and sense amplifiers that tend to cause relatively large local supply noise when activated.

BRIEF DESCRIPTION OF THE DRAWINGS

The foregoing aspects and many of the attendant advantages of this invention will become more readily appreciated by reference to the following detailed description and the following drawings.

DETAILED DESCRIPTION

Figure 1:
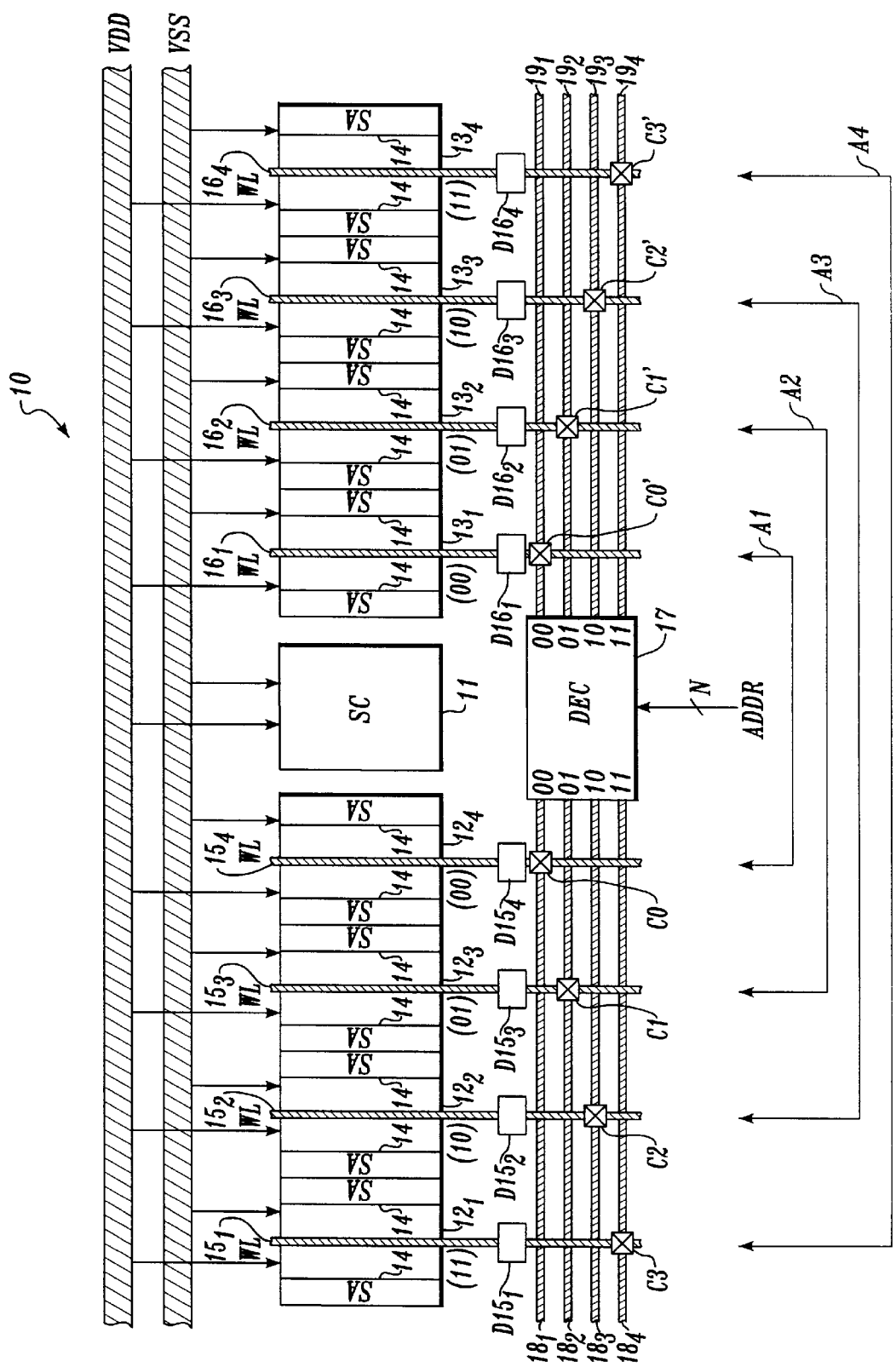
FIG. 1 is a diagram illustrative of a conventional array arrangement for a memory device.
Figure 2:
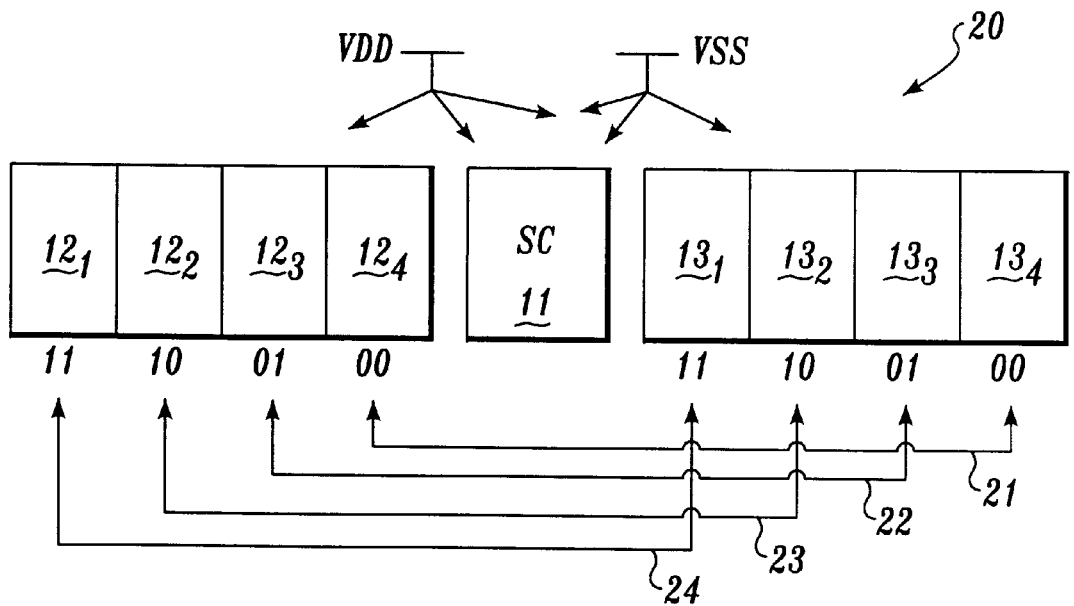
FIG. 2 is diagram illustrative of an activation arrangement according to one embodiment of the present invention.

FIG. 2 is diagram schematically illustrative of a portion 20 of an activation arrangement according to one embodiment of the present invention. For clarity, like reference numerals are used between drawings for elements having the same or similar function or structure. As in the conventional mirrored activation arrangement, this embodiment of present invention includes array blocks $12_1$–$12_4$ and $13_1$–$13_4$, shared circuitry 11 and VDD and VSS supply buses. However, in accordance with the present invention, the mapping or activation of the array blocks with respect to addresses is not mirrored. Instead, the activation is distributed so as to minimize the worst case supply bus noise. In one embodiment, the mapping of array blocks $12_1$–$12_4$ remain as described for the arrangement of FIG. 1; however, the mapping of array blocks $13_1$–$13_4$ is reversed. Thus, in accessing address 00X, array blocks $12_4$ and $13_4$ are activated, as indicated by arrows 21. Similarly, in accessing address 01X, array blocks $12_3$ and $13_3$ are activated as indicated by arrows 22. Likewise, array block pair $12_2$ and $13_2$, and array block pair $12_1$ and $13_1$ respectively are activated in accessing addresses 10X and 11X, as indicated by arrows 23 and 24, respectively. Because any unique mapping of the addresses to the array blocks can be used in a memory device, the overall functionality of the memory device is not changed (i.e., the changes are transparent to the user of the memory device). Embodiments of this activation arrangement are described below in conjunction with FIGS. 4 and 5.

Because, in this embodiment present invention, when an array block nearest to shared circuitry 11 is activated (e.g., array block $12_4$), the corresponding activated array block in the opposite group is the array block that is farthest away from shared circuitry 11 (e.g., array block $13_4$). As a result, this activation arrangement advantageously reduces the worst case supply noise in portions of the supply voltage buses near shared circuitry 11 when compared to the aforementioned conventional activation arrangement.

Figure 3:
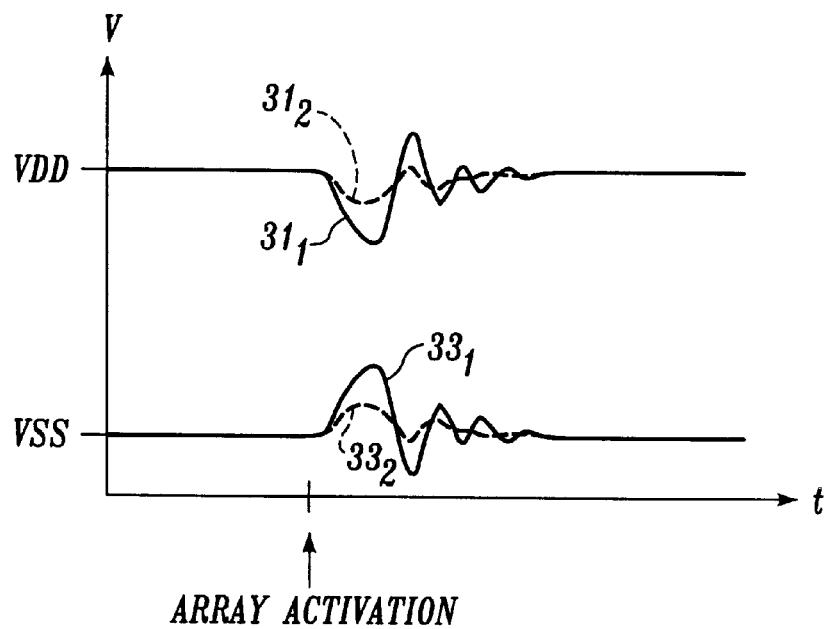
FIG. 3 is a diagram illustrative of supply noise in the supply voltage proximate to logic circuitry that is shared by several array blocks.

FIG. 3 is a diagram illustrating the reduction of the supply noise in the supply buses proximate to shared circuitry 11 (FIG. 2). In particular, waveforms $31_1$ and $31_2$ represent the level of the voltage at the VDD supply bus in the region near shared circuitry 11 according to the activation arrangements of FIGS. 1 and 2, respectively. As can been seen in FIG. 3, the magnitude variation of waveform $31_2$ (non-mirrored activation) is significantly lower than that of waveform $31_1$ (mirrored activation). Similarly, waveforms $33_1$ and $33_2$ represent the level of the voltage at the VSS supply bus in the region near shared circuitry 11 according to the activation arrangements of FIGS. 1 and 2, respectively. As can been seen in FIG. 3, the magnitude variation of waveform $33_2$ (non-mirrored activation) is significantly lower than that of waveform $33_1$ (mirrored activation).

Figure 4:
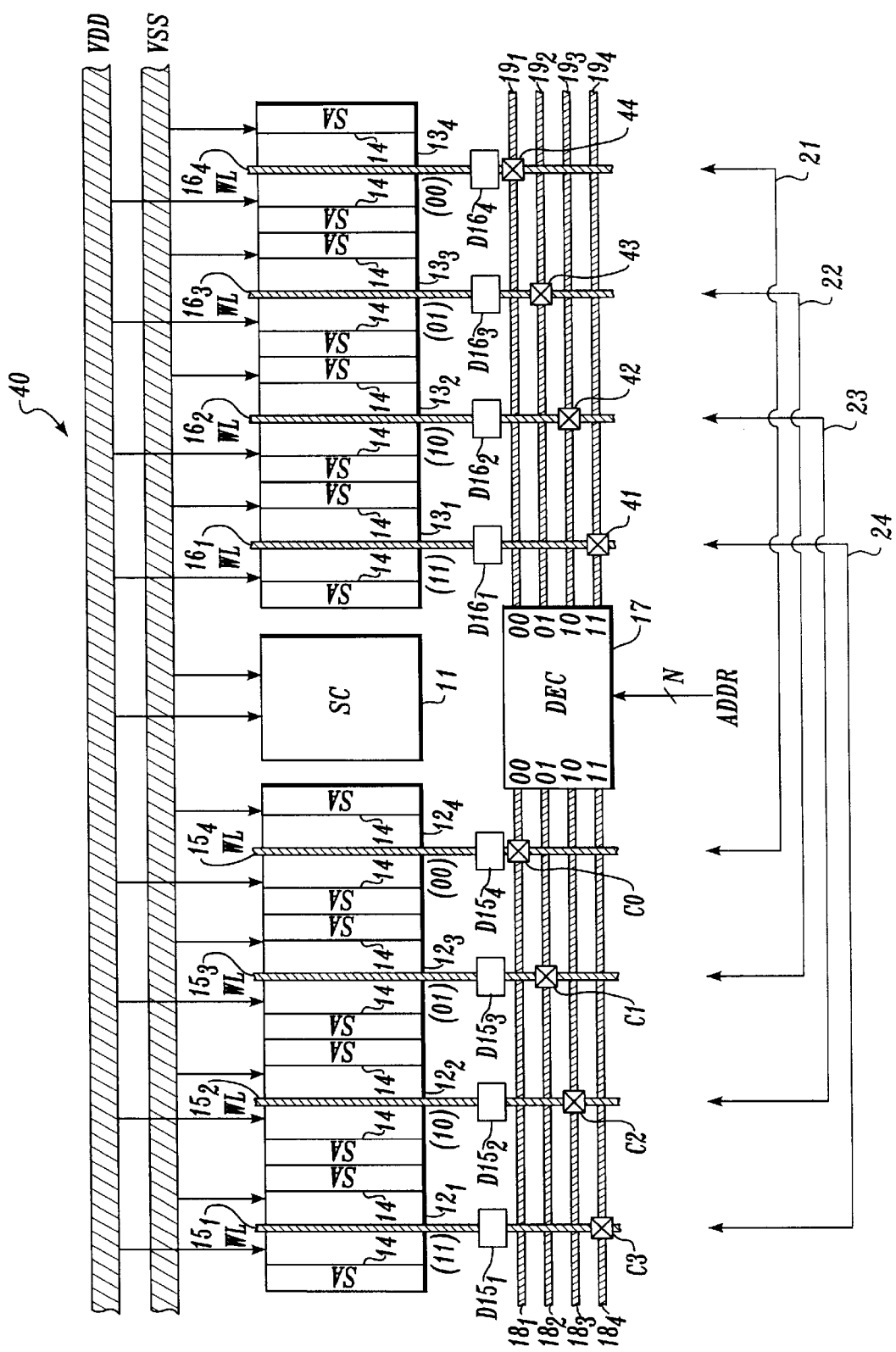
FIG. 4 is a diagram illustrative of an array arrangement for a memory device, according to one embodiment of the present invention.

FIG. 4 is a diagram illustrative of a portion 40 of an array arrangement with an activation implementation according to one embodiment of the present invention. Portion 40 is substantially similar to portion 10 (FIG. 1), except that portion 40 includes connection structures 41–44 instead of connection structures C0'–C3' as in portion 10 (FIG. 1). In this embodiment, connection structures 41–44 respectively provide interconnection between decoder line segments $19_4$–$19_1$ (i.e., reverse order) and the wordline decoders of wordlines $16_1$–$16_4$, respectively. Those skilled in the art of memory devices will appreciate that banks of sense amplifiers 14 may be shared by adjacent array blocks, thereby reducing the total number of sense amplifier banks in the device. This activation arrangement operates as follows.

When address 00X is accessed, decoder 17 generates an activation signal on decoder line segments $18_1$ and $19_1$ that propagates through connection structures C0 and 44 to the wordline decoders of wordlines $15_4$ and $16_4$, respectively. As a result, array blocks $12_4$ and $13_4$ are activated, as indicated by arrows 21. In contrast to the aforementioned conventional mirrored activation arrangement, the two array blocks nearest shared circuitry 11 are not simultaneously activated, thereby advantageously reducing the worst case localized supply noise in the region near shared circuitry 11.

In a similar manner, when address 01X is accessed, decoder 17 generates an activation signal on decoder line segments $18_2$ and $19_2$ that propagates through connection structures C1 and 43 to the wordline decoders of wordlines $15_3$ and $16_3$, respectively. As a result, array blocks $12_3$ and $13_3$ are activated, as indicated by arrows 22. Array blocks $12_2$ and $13_2$ and array blocks $12_1$ and $13_1$ are similarly activated through connection structures C2 and 42 and connection structures C3 and 41, respectively. It will be appreciated that although the supply bus noise incurred by accessing address 11X in this embodiment is greater than in the mirrored arrangement of FIG. 1, this higher supply noise is not a disadvantage because the worst case supply bus noise in this embodiment is significantly lower than in the mirrored arrangement of FIG. 1. Thus, advantageously, the circuit designer has more flexibility in designing the circuit because shared circuitry 11 need not be designed to tolerate the relatively high supply bus noise incurred in the mirrored activation scheme of FIG. 1.

This embodiment describes the use of "connection structures" to implement the interconnections between the decoder line segments and the wordline decoders of the wordlines. More specifically, in embodiments in which both the decoder line segments and the connections to the wordline decoders of the array blocks are implemented in metal layers, the connection structures include vias. Then, typically, contacts are formed to interconnect the wordline decoder output lines to the corresponding wordlines, which are commonly formed from doped polysilicon in many memory devices.

Figure 5:
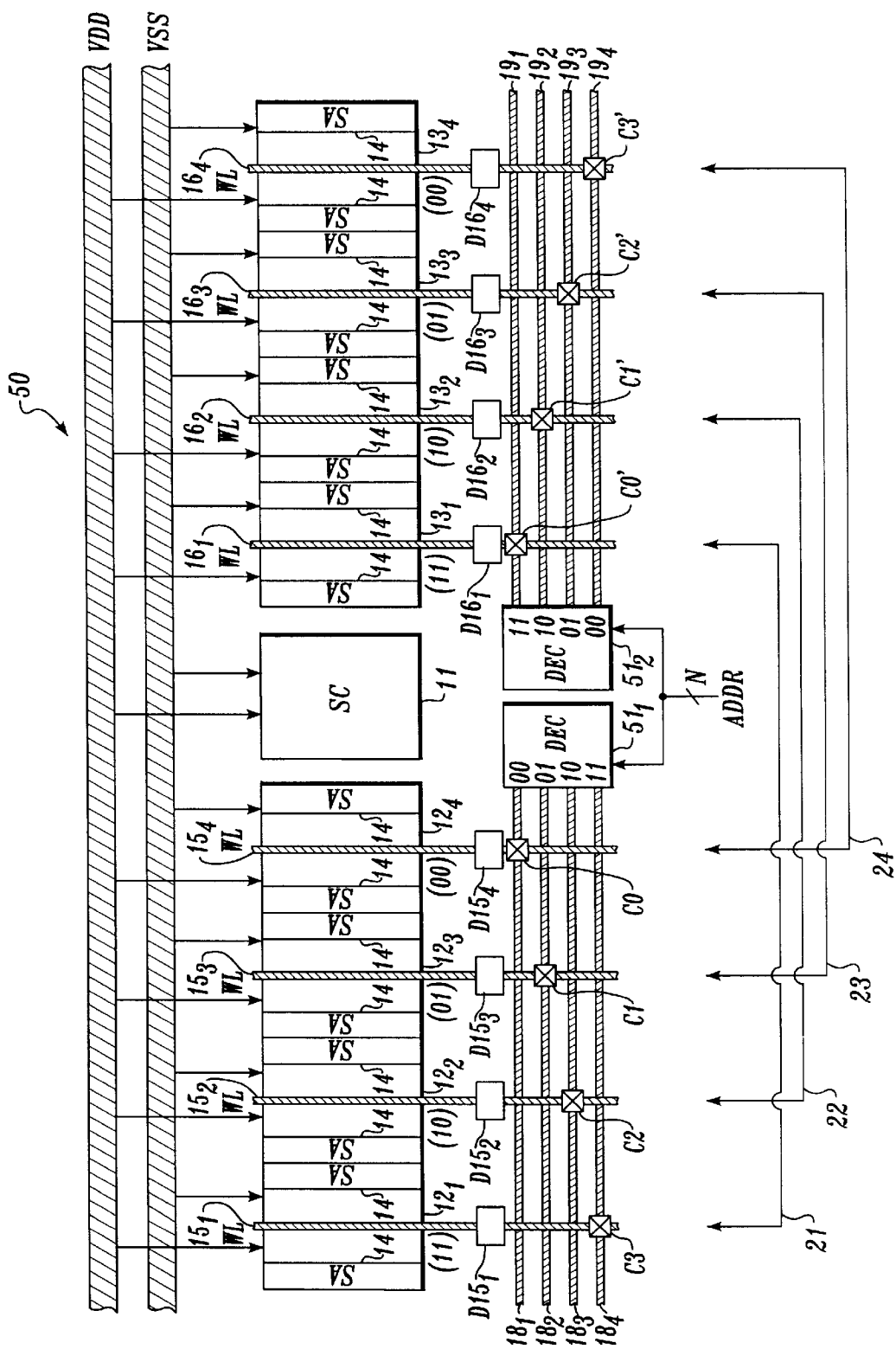
FIG. 5 is a diagram illustrative of an array arrangement for a memory device, according to another embodiment of the present invention.

FIG. 5 is a diagram illustrative of a portion 50 of an array arrangement with an alternative activation implementation according to the present invention. This embodiment is advantageously used in circuits in which the decoder line segments $18_1$–$18_4$ are not electrically continuous with decoder line segments $19_1$–$19_4$, respectively. Portion 50 is substantially similar to portion 10 (FIG. 1), except that portion 50 includes decoders $51_1$ and $51_2$ instead of decoder 17 (FIG. 1). In this embodiment, decoder $51_1$ generates activation signals on decoder line segments $18_1$–$18_4$ when addresses 00X–11X are accessed, respectively. In contrast, decoder $51_2$ is configured to generate activation signals on the decoder line segments in reverse order. More specifically, decoder $51_2$ generates activation signals on decoder line segments $19_4$–$19_1$ (reverse order) when address 00X–11X are accessed.

Due to this activation arrangement, when address 00X is accessed, decoders $51_1$ and $51_2$ generate activation signals on decoder line segments $18_1$ and $19_4$, respectively. These activation signals propagate through contacts C0 and C3' to the wordline decoders of wordlines $15_4$ and $16_4$, respectively. As a result, array blocks $12_4$ and $13_4$ are activated, as indicated by arrows 24. In a similar manner, when address 01X is accessed, decoders $51_1$ and $51_2$ generate activation signals on decoder line segments $18_2$ and $19_3$, respectively. These activation signals propagate through connection structures C1 and C2' to the wordline decoders of wordlines $15_3$ and $16_3$, respectively. As a result, array blocks $12_3$ and $13_3$ are activated, as indicated by arrows 23. Array blocks $12_2$ and $13_2$ and array blocks $12_1$ and $13_1$ are similarly activated through connection structures C2 and C1' and connection structures C3 and C0', respectively. Thus, the same non-mirrored activation arrangement and corresponding benefits described above in conjunction with FIG. 4 are achieved in this embodiment.

In a slight modification of this embodiment, an array decoder (i.e., such as array decoder $51_1$) is part of a mirrored placement group that includes several array blocks (i.e., such as array blocks $12_1$–$12_4$). Thus, decoder $51_1$ and array blocks $12_1$–$12_4$ can be instantiated during the design process near shared circuitry 11, with decoder $51_2$ and array blocks $13_1$–$13_4$ being instantiated simply as mirror image of this placement group on the opposite side of shared circuitry 11. This process advantageously simplifies the design and layout process. The array decoders would be identical, but the stepped array block activation scheme can be implemented through the interlayer connection structures as in the embodiment of FIG. 4.

Although supply noise effects on shared circuitry are described above, other types of supply noise problems may occur. For example, supply noise problems may occur in programming an EEPROM device. Supply noise effects due mirrored activation may tend to decrease the uniformity of the programming level between array blocks of the EEPROM device. This may undesirably result in some array blocks being too strongly programmed while some other array blocks may not programmed strongly enough.

The embodiments of the array arrangement described above are illustrative of the principles of the present invention and are not intended to limit the invention to the particular embodiments described. For example, in light of the present disclosure, those skilled in the art, without undue experimentation, can devise implementations for integrated circuit devices with mirrored circuit block placement other than the memory devices described above. In addition, the activation arrangement may be implemented using selection circuitry other than that described. For example, arrangements of the decoders, decoder lines, wordlines and interlayer interconnects may be different in other embodiments. Accordingly, while the preferred embodiment of the invention has been illustrated and described, it will be appreciated that various changes can be made therein without departing from the spirit and scope of the invention.

I claim:

1. A method of activating blocks of circuitry of a plurality of blocks of circuitry, the plurality of blocks of circuitry including a first group and a second group, the first group and the second group being symmetrically located about a shared circuit, the method comprising:

configuring the plurality of blocks of circuitry so that every block of circuitry in the first group is uniquely associated with a corresponding block of circuitry in the second group, wherein activation of a block of circuitry from the first group is essentially concurrent with activation of the corresponding block of circuitry from the second group;

wherein a block of circuitry from the first group that is closest to the shared circuit is associated with a block of circuitry from the second group other than a block of circuitry of the second group that is closest to the shared circuit; and wherein a block of circuitry from the second group that is closest to the shared circuit is associated with a block of circuitry from the first group other than the block of circuitry of the first group that is closest to the shared circuit.

2. The method of claim 1 wherein the plurality of blocks of circuitry are array blocks of a memory device.

3. The method of claim 2 further comprising activating an array block of the first group and its corresponding array block in the second group in response to receiving a memory address, the activated array blocks uniquely corresponding to the memory address.

4. The method of claim 3 wherein activating an array block comprises activating sense amplifiers corresponding to the array block.

5. The method of claim 3 wherein activating an array block comprises charging a wordline in the array block.

6. The method of claim 5 wherein charging a wordline comprises charging a decoder line mapped to the wordline using a decoder circuit coupled to receive a memory address.

7. The method of claim 6 wherein charging the decoder line activates a second decoder coupled to the decoder line and the wordline.

8. The method of claim 6 wherein the decoder circuit comprises a first decoder configured to activate a wordline in the first group, and further comprises a second decoder configured to activate a wordline in the second group.

9. The method of claim 1 wherein the plurality of blocks of circuitry are configured so that when the block of circuitry of the first group closest to the shared circuit is activated, a block of circuitry of the second group that is farthest away from the shared circuit is activated.

10. The method of claim 9 wherein the plurality of blocks of circuitry are further configured so that when a block of circuitry of the first group second closest to the shared circuit is activated, a block of circuitry of the second group that is second farthest away from the shared circuit is activated.

11. An integrated circuit structure comprising:
a first plurality of circuit blocks;
a second plurality of circuit blocks, each circuit block of the second plurality of circuit blocks corresponding to a unique circuit block of the first plurality of circuit blocks;
a shared circuit disposed between the first and second pluralities of circuit blocks; and
a selection circuit configured to selectively activate each circuit block in the first plurality of circuit blocks and the corresponding circuit block in the second plurality of circuit blocks, wherein when a circuit block of the first plurality of circuit blocks that is closest to the shared circuit is activated, the corresponding circuit block of the second plurality of circuit blocks is a circuit block that is not closest to the shared circuit is activated.

12. The integrated circuit structure of claim 11 wherein the first and second pluralities of circuit blocks are array blocks of a memory device.

13. The integrated circuit structure of claim 12 wherein the selection circuit is further configured to activate an array block of the first plurality of circuit blocks and its corresponding array block in the second plurality of circuit blocks in response to receiving a memory address, the activated array blocks uniquely corresponding to the memory address.

14. The integrated circuit structure of claim 13 wherein activating an array block comprises activating sense amplifiers corresponding to the array block.

15. The integrated circuit structure of claim 13 wherein activating an array block comprises charging a wordline in the array block.

16. The integrated circuit structure of claim 15 wherein the selection circuit comprises a decoder that is configured to charge a decoder line mapped to the wordline of the array block being activated, the decoder being coupled to receive a memory address.

17. The integrated circuit structure of claim 16 comprising a second decoder coupled to the decoder line and the wordline.

18. The integrated circuit structure of claim 16 wherein the selection circuit comprises a first decoder configured to activate a wordline in the first plurality of circuit blocks, and further comprises a second decoder configured to activate a wordline in the second plurality of circuit blocks.

19. The integrated circuit structure of claim 11 wherein the selection circuit is configured so that when the circuit block of the first plurality of circuit blocks closest to the shared circuit is activated, a circuit block of the second plurality of circuit blocks that is farthest away from the shared circuit is activated.

20. The integrated circuit structure of claim 19 wherein the selection circuit is further configured so that when a circuit block of the first plurality of circuit blocks second closest to the shared circuit is activated, a circuit block of the second plurality of circuit blocks that is second farthest away from the shared circuit is activated.

21. An integrated circuit structure comprising:
a first plurality of circuit blocks;
a second plurality of circuit blocks, each circuit block of the second plurality of circuit blocks corresponding to a unique circuit block of the first plurality of circuit blocks;
a shared circuit disposed between the first and second pluralities of circuit blocks; and
means for selectively activating each circuit block in the first plurality of circuit blocks and the corresponding circuit block in the second plurality of circuit blocks, wherein when a circuit block of the first plurality of circuit blocks that is closest to the shared circuit is activated, the corresponding circuit block of the second plurality of circuit blocks is a circuit block that is not closest to the shared circuit is activated.

22. The integrated circuit structure of claim 21 wherein the first and second pluralities of circuit blocks are array blocks of a memory device.

23. The integrated circuit structure of claim 22 wherein the means for selectively activating is further configured to activate an array block of the first plurality of circuit blocks and its corresponding array block in the second plurality of circuit blocks in response to receiving a memory address, the activated array blocks uniquely corresponding to the memory address.

24. The integrated circuit structure of claim 23 wherein activating an array block comprises activating sense amplifiers corresponding to the array block.

25. The integrated circuit structure of claim 23 wherein activating an array block comprises charging a wordline in the array block.

26. The integrated circuit structure of claim 25 wherein the means for selectively activating comprises a decoder and a plurality of decoder lines, the decoder being configured to charge a decoder line, of the plurality of decoder lines, that is mapped to the wordline of the array block being activated, the decoder being coupled to receive a memory address.

27. The integrated circuit structure of claim 26 wherein the means for selectively activating further comprises a means for connecting the decoder line to the wordline.

28. The integrated circuit structure of claim 26 wherein the selection circuit comprises a first decoder configured to activate a wordline in the first plurality of circuit blocks, and further comprises a second decoder configured to activate a wordline in the second plurality of circuit blocks.

29. The integrated circuit structure of claim 21 wherein the means for selectively activating is configured so that when the circuit block of the first plurality of circuit blocks closest to the shared circuit is activated, a circuit block of the second plurality of circuit blocks that is farthest away from the shared circuit is activated.

30. The integrated circuit structure of claim 29 wherein the means for selectively activating is further configured so that when a circuit block of the first plurality of circuit blocks second closest to the shared circuit is activated, a circuit block of the second plurality of circuit blocks that is second farthest away from the shared circuit is activated.

* * * * *